United States Patent
Lin et al.

(10) Patent No.: US 10,461,776 B2
(45) Date of Patent: Oct. 29, 2019

(54) DEVICE AND METHOD OF CONTROLLING AN ITERATIVE DECODER

(71) Applicant: Realtek Semiconductor Corp., HsinChu (TW)

(72) Inventors: Chuan-Hu Lin, Changhua County (TW); Wei-Chieh Huang, Hsinchu County (TW); Chia-Chun Tsui, Hsinchu (TW); Chung-Yao Chang, Hsinchu County (TW)

(73) Assignee: Realtek Semiconductor Corp., HsinChu (TW)

( * ) Notice: Subject to any disclaimer, the term of this patent is extended or adjusted under 35 U.S.C. 154(b) by 73 days.

(21) Appl. No.: 15/862,596

(22) Filed: Jan. 4, 2018

(65) Prior Publication Data

US 2018/0248563 A1   Aug. 30, 2018

(30) Foreign Application Priority Data

Feb. 24, 2017 (TW) .............................. 106106292 A

(51) Int. Cl.
*H03M 13/00* (2006.01)
*H03M 13/11* (2006.01)
*G06F 11/10* (2006.01)
*H03M 13/39* (2006.01)

(52) U.S. Cl.
CPC ...... *H03M 13/1108* (2013.01); *H03M 13/114* (2013.01); *G06F 11/1044* (2013.01); *H03M 13/3927* (2013.01)

(58) Field of Classification Search
None
See application file for complete search history.

(56) References Cited

U.S. PATENT DOCUMENTS

| 2007/0168830 | A1 | 7/2007 | Shin | |
|---|---|---|---|---|
| 2008/0256343 | A1* | 10/2008 | Gross | G05B 19/045 712/223 |
| 2012/0198308 | A1* | 8/2012 | Varnica | H03M 13/29 714/760 |
| 2014/0068381 | A1* | 3/2014 | Zhang | H03M 13/1102 714/770 |

* cited by examiner

*Primary Examiner* — Daniel F. McMahon
(74) *Attorney, Agent, or Firm* — Winston Hsu

(57) ABSTRACT

A receiving device comprises an iterative decoder, a first determination unit and a control unit. The iterative decoder is for receiving at least one coded signal and for performing an iterative decoding on the at least one coded signal, to generate a plurality of decoded signals, wherein the plurality of decoded signals comprise a first decoded signal from a first iteration, a second decoded signal from a second iteration and a third decoded signal from a third iteration. The first determination unit is for determining whether the plurality of decoded signals diverge, to generate a first determination result. The control unit is for generating a control signal according to at least the first determination result, wherein the control signal indicates the iterative decoder whether to stop performing the iterative decoding on the at least one coded signal.

9 Claims, 6 Drawing Sheets

US 10,461,776 B2

DEVICE AND METHOD OF CONTROLLING AN ITERATIVE DECODER

BACKGROUND OF THE INVENTION

1. Field of the Invention

The present invention relates to a device and a method used in a communication system, and more particularly, to a device and a method of controlling an iterative decoder.

2. Description of the Prior Art

In a wireless communication system, there are various ways to decode coded signals, where iterative decoding (or called recursive decoding) has a better performance (i.e., lower bit error rate (BER)). However, a complete computation of an iterative decoding includes a plurality of iterative operations, and a plurality of decoded signals are generated correspondingly. Disadvantages such as more power consumption and longer delay are caused. Thus, how to overcome the disadvantages of the iterative decoding while the performance of the iterative decoding is kept is an important problem to be solved.

SUMMARY OF THE INVENTION

The present invention therefore provides a device and a method of controlling an iterative decoder, for processing the iterative decoding, to solve the above problem.

A receiving device comprises an iterative decoder, for receiving at least one coded signal and for performing an iterative decoding on the at least one coded signal, to generate a plurality of decoded signals, wherein the plurality of decoded signals comprise a first decoded signal from a first iteration, a second decoded signal from a second iteration and a third decoded signal from a third iteration; a first determination unit, coupled to the iterative decoder, for determining whether the plurality of decoded signals diverge, to generate a first determination result; and a control unit, coupled to the first determination unit, for generating a control signal according to at least the first determination result, wherein the control signal indicates the iterative decoder whether to stop performing the iterative decoding on the at least one coded signal.

A controlling method is for controlling the operations of the iterative decoder.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
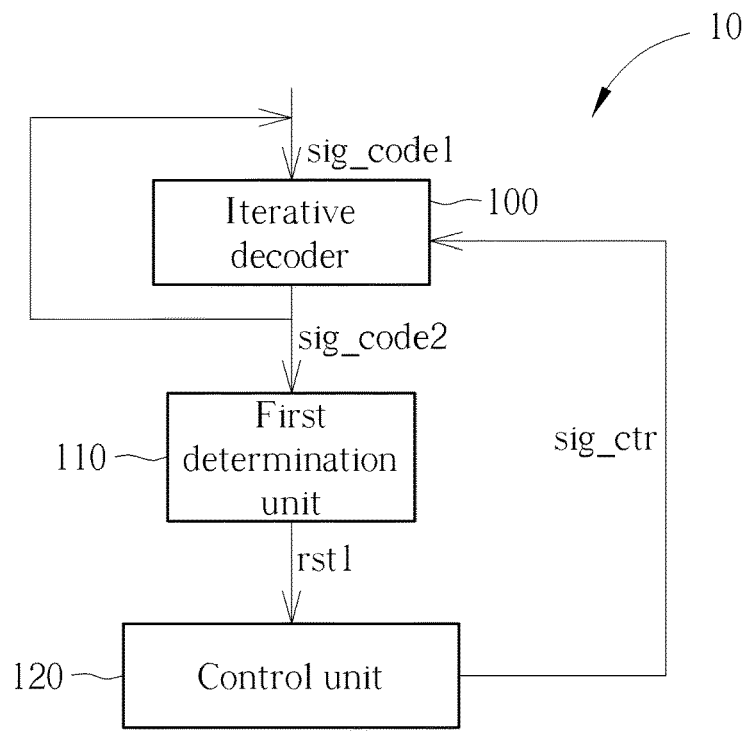
FIG. 1 is a schematic diagram of a receiving device according to an example of the present invention.

FIG. 1 is a schematic diagram of a receiving device 10 according to an example of the present invention. The receiving device 10 includes an iterative decoder 100, a first determination unit 110 and a control unit 120. In detail, the iterative decoder 100 is for receiving at least one coded signal sig_code1 and for performing an iterative decoding on the at least one coded signal sig_code1 to generate a plurality of decoded signals sig_code2, wherein the plurality of decoded signals sig_code2 include a first decoded signal from a first iteration, a second decoded signal from a second iteration and a third decoded signal from a third iteration. The first determination unit 110 is coupled to the iterative decoder 100, for determining whether the plurality of decoded signals sig_code2 diverge, to generate a first determination result rst1. The control unit 120 is coupled to the first determination unit 110, for generating a control signal sig_ctr according to at least the first determination result rst1, wherein the control signal sig_ctr indicates the iterative decoder 100 whether to stop performing the iterative decoding on the at least one coded signal sig_code1.

According to the present invention, the receiving device 10 may directly stop the iterative decoding by using the determination result to avoid (meaningless) subsequent decoding operations of the iterative decoder 100, when determining that the coded signals cannot be decoded correctly (e.g., determining that the plurality of decoded signals diverge). The present invention not only saves unnecessary power consumption but also reduces decoding delay.

Figure 2:
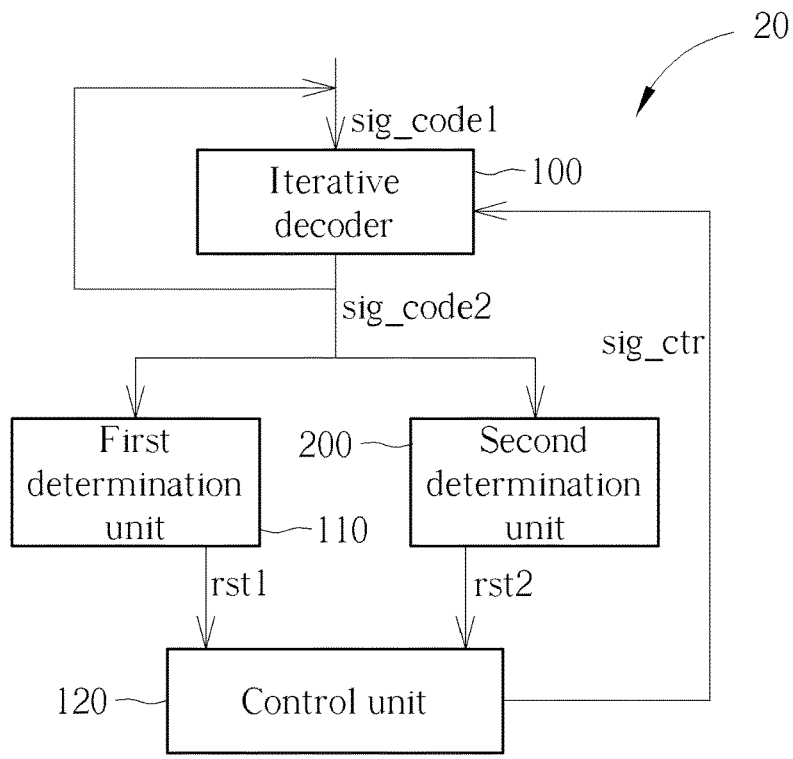
FIG. 2 is a schematic diagram of a receiving device according to an example of the present invention.

FIG. 2 is a schematic diagram of a receiving device 20 according to an example of the present invention. Comparing with the receiving device 10, the receiving device 20 further includes a second determination unit 200. The second determination unit 200 is coupled to the iterative decoder 100 and the control unit 120, for performing an error detection on the plurality of decoded signals sig_code2, to generate a second determination result rst2. In this situation, the control unit 120 may generate the control signal sig_ctr according to the first determination result rst1 and the second determination result rst2. The operation method of the iterative decoder 100 and the first determination unit 110 can be referred to the previous description, and is not narrated herein. In one example, the control unit 120 indicates the iterative decoder 100 to stop performing the iterative decoding on the at least one coded signal sig_code1, when the second determination result rst2 indicates that the plurality of decoded signals sig_code2 pass the error detection. In one example, the control unit 120 indicates the iterative decoder 100 to keep performing the iterative decoding on the at least one coded signal sig_code1, when the second determination result rst2 indicates that the plurality of decoded signals sig_code2 do not pass the error detection and the first determination result rst1 indicates that the plurality of decoded signals sig_code2 do not diverge. By using the plurality of determination results, the unnecessary power consumption can be further saved and the decoding delay can be reduced.

In one example, the iterative decoder 100 may be a turbo decoder or a Low Density Parity Check Codes (LDPC) decoder, for decoding received signals encoded according to an error control code (ECC). The ECC may be a code such as a turbo code or a LDPC, but is not limited herein.

In one example, the first determination unit 110 may perform the following steps to determine whether the plurality of decoded signals sig_code2 diverge: performing a sign difference (SD) operation on the plurality of decoded signals sig_code2, for computing a sum of a plurality of corresponding differences between the plurality of decoded signals sig_code2 (i.e., between the first decoded signal, the second decoded signal and the third decoded signal), respectively, to generate a plurality of sum signals; comparing a size of the plurality of sum signals, respectively, to generate a plurality of comparison results; and determining whether the plurality of decoded signals sig_code2 diverge according to the plurality of comparison results to generate the first determination result rst1.

In one example, the plurality of corresponding differences include at least one of a plurality of log-likelihood ratio (LLR) differences, a plurality of extrinsic information differences and a plurality of priori information differences.

The following examples are used for illustrating several operation examples of the receiving device 20.

There are various ways according to which the control unit 120 determines whether to indicate the iterative decoder 100 to stop performing the iterative decoding according to the first determination result rst1 and/or the second determination result rst2. In one example, the control unit 120 indicates the iterative decoder 100 to stop performing the iterative decoding on the at least one coded signal sig_code1, when the second determination result rst2 indicates that the plurality of decoded signals sig_code2 pass a cyclic redundancy check (CRC). In one example, the control unit 120 indicates the iterative decoder 100 to stop performing the iterative decoding on the at least one coded signal sig_code1, when the second determination result rst2 indicates that the plurality of decoded signals sig_code2 do not pass the CRC and the first determination result rst1 indicates that the plurality of decoded signals sig_code2 diverge. In one example, the control unit 120 indicates the iterative decoder 100 to stop performing the iterative decoding on the at least one coded signal sig_code1, when a number of times of a plurality of decodings performed by the iterative decoder 100 is greater than a predetermined number of times. In one example, a determination of the predetermined number of times is related to environmental channel noise.

In one example, the control unit 120 indicates the iterative decoder 100 to keep performing the iterative decoding on the at least one coded signal sig_code1, when the second determination result rst2 indicates that the plurality of decoded signals sig_code2 do not pass the CRC and the first determination result rst1 indicates that the plurality of decoded signals sig_code2 converge. In one example, the control unit 120 indicates the iterative decoder 100 to keep performing the iterative decoding on the at least one coded signal sig_code1, when the second determination result rst2 indicates that the plurality of decoded signals sig_code2 do not pass the CRC and the first determination result rst1 indicates that the plurality of decoded signals sig_code2 do not converge and do not diverge.

There are various ways according to which the first determination unit 110 determines that the plurality of decoded signals sig_code2 converge or diverge. In one example, the first determination unit 110 generates the first determination result rst1 indicating that the plurality of decoded signals sig_code2 converge, when a sum of a plurality of corresponding differences between the plurality of decoded signals sig_code2 (i.e., between the first decoded signal, the second decoded signal and the third decoded signal) is smaller than a predetermined value. The first determination unit 110 generates the first determination result rst1 indicating that the plurality of decoded signals sig_code2 diverge, when the sum of the plurality of corresponding differences between the plurality of decoded signals sig_code2 (i.e., between the first decoded signal, the second decoded signal and the third decoded signal) is not smaller than the predetermined value. Further, the plurality of corresponding differences may be a plurality of LLR differences, a plurality of extrinsic information differences or a plurality of priori information differences.

In one example, the first determination unit 110 may determine whether the plurality of decoded signals sig_code2 converge or diverge according to the following steps. The first determination unit 110 calculates a first sum of a first plurality of corresponding differences between the first decoded signal and the second decoded signal. The first determination unit 110 calculates a second sum of a second plurality of corresponding differences between the second decoded signal and the third decoded signal. The first determination unit 110 sets a value to 0 when the first sum is greater than the second sum, and the first determination unit 110 sets the value to 1 when the first sum is not greater than the second sum. The first determination unit 110 generates the first determination result rst1 indicating that the plurality of decoded signals sig_code2 converge, when the value is smaller than a predetermined value. The first determination unit 110 generates the first determination result rst1 indicating that the plurality of decoded signals sig_code2 diverge, when the value is not smaller than the predetermined value. In other words, a window with a length of 2 can be used for comparing differences between the two sets of the decoded signals to improve accuracy of the determination.

In one example, the first determination unit 110 may determine whether the plurality of decoded signals sig_code2 converge or diverge according to the following steps. The first determination unit 110 calculates a first sum of a first plurality of corresponding differences between the first decoded signal and the second decoded signal. The first determination unit 110 calculates a second sum of a second plurality of corresponding differences between the second decoded signal and the third decoded signal. The first determination unit 110 calculates a third sum of a third plurality of corresponding differences between the third decoded signal and a fourth decoded signal. The first determination unit 110 sets a first value to 0 when the first sum is greater than the second sum, and the first determination unit 110 sets the first value to 1 when the first sum is not greater than the second sum. The first determination unit 110 sets a second value to 0 when the second sum is greater than the third sum, and the first determination unit 110 sets the second value to 1 when the second sum is not greater than the third sum. The first determination unit 110 sums the first value and the second value to obtain a value. The first determination unit 110 generates the first determination result rst1 indicating that the plurality of decoded signals sig_code2 converge when the value is smaller than a predetermined value. The first determination unit 110 generates the first determination result rst1 indicating that the plurality of decoded signals sig_code2 diverge when the value is not smaller than the predetermined value. In other words, a window with a length of 3 can be used for comparing differences between the three sets of the decoded signals to improve the accuracy of the determination.

It should be noted that the above examples are used for illustrating a method of comparing multiple sets of coded signals with the window lengths 2 and 3. Those skilled in the art may obtain a similar example with a window length of any positive integer greater than 1 according to the above examples.

Figure 3:
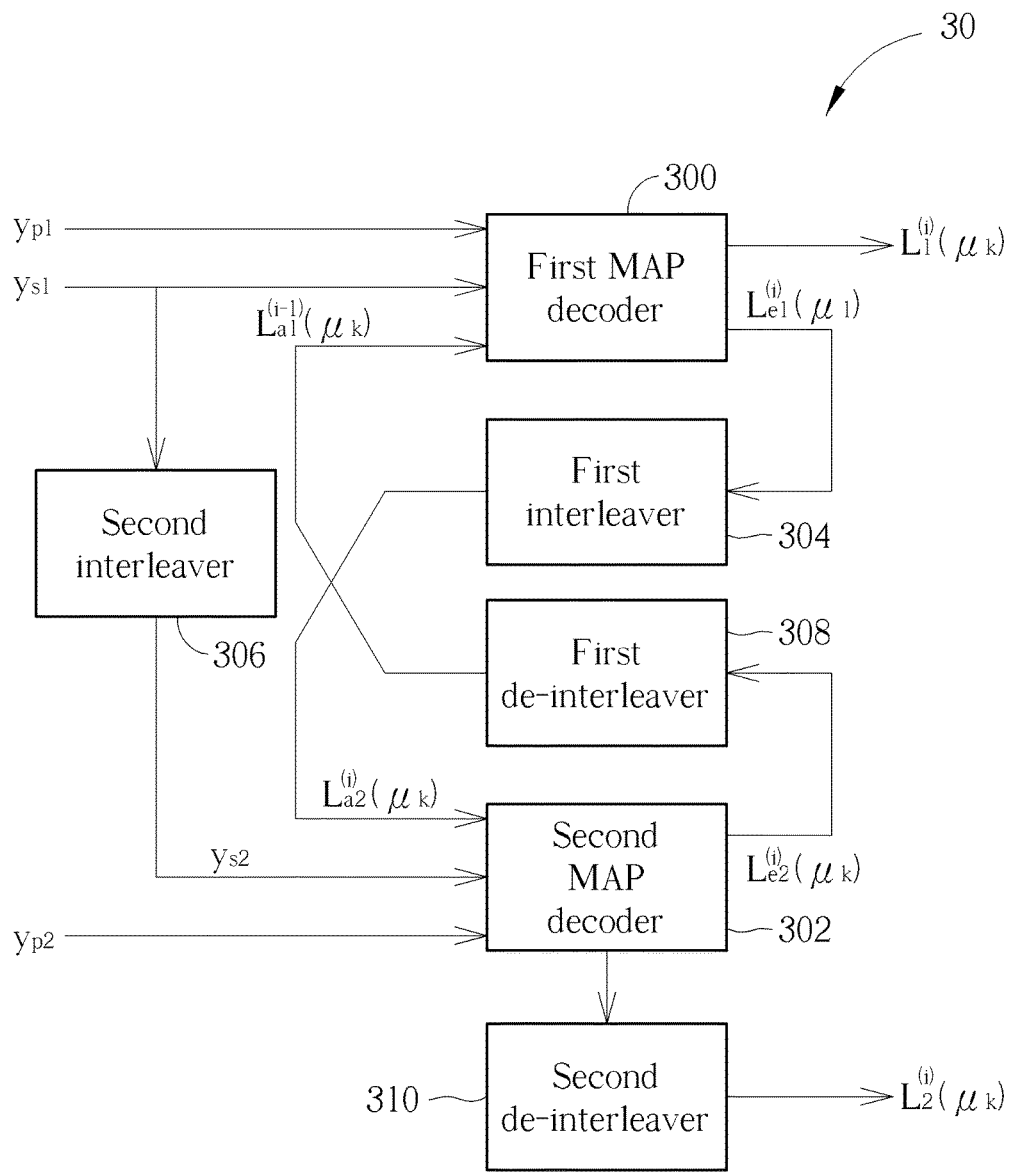
FIG. 3 is a schematic diagram of a turbo decoder according to an example of the present invention.

FIG. 3 is a schematic diagram of a turbo decoder 30 with a code rate 1/3 according to an example of the present invention, to illustrate the iterative decoder 100 in FIG. 2. The turbo decoder 30 includes a first maximum a posteriori (MAP) decoder 300, a second MAP decoder 302, a first interleaver 304, a second interleaver 306, a first de-interleaver 308 and a second de-interleaver 310. In FIG. 3, $y_{s1}$, $y_{s2}$ are systematic part of received bits (e.g., soft bits), $y_{p1}$, $y_{p2}$ are parity part of the received bits (e.g., soft bits), $u_k$ is the kth information bit, $L_m$ is LLR, m=1, 2, $L_{em}$ is extrinsic information outputted by the mth MAP decoder, $L_{am}$ is priori information for being inputted to the mth MAP decoder, and the index i represents the ith iteration. The extrinsic information outputted by the first MAP decoder 300 $L_{e1}$ is processed by the first interleaver 304 as the priori information for being inputted to the second MAP decoder 302 $L_{a2}$. Accordingly, the extrinsic information outputted by the second MAP decoder 302 $L_{e2}$ is processed by the first de-interleaver 308 as the priori information for being inputted to the second MAP decoder 300 $L_{a1}$.

There are three ways for determining the SD (positive or negative) according to the above information generated by the turbo decoder 30:

(1) Hard-decision-aided (HDA):

$$f_m^{(i)}(k) = \begin{cases} 0, & \text{if sign}\{L_m^{(i)}(\mu_k)\} = \text{sign}\{L_m^{(i-1)}(\mu_k)\}, \\ 1, & \text{else} \end{cases} \quad \text{(Eq. 1)}$$

$$i \geq 1, m = 1, 2$$

(2) Sign-change ratio (SCR):

$$f_m^{(i)}(k) = \begin{cases} 0, & \text{if sign}\{L_{em}^{(i)}(\mu_k)\} = \text{sign}\{L_{em}^{(i)}(\mu_k)\}, \\ 1, & \text{else} \end{cases} \quad \text{(Eq. 2)}$$

$$i \geq 1, m = 1, 2$$

(3) Sign-difference ratio (SDR):

$$f_m^{(i)}(k) = \begin{cases} 0, & \text{if sign}\{L_{am}^{(i)}(\mu_k)\} = \text{sign}\{L_{em}^{(i)}(\mu_k)\}, \\ 1, & \text{else} \end{cases} \quad \text{(Eq. 3)}$$

$$i \geq 0, m = 1, 2$$

Calculate a sum SD according to the SD:

$$N_m^{(i)} = \sum_{k=0}^{K-1} f_m^{(i)}(k), \quad \text{(Eq. 4)}$$

where K is the number of information bits.

According to the mentioned above, an operation method of the receiving device 20 is described below.

1. Average two sum SDs outputted by the MAP decoders to improve the stability:

$$N^{(i)} = \frac{N_1^{(i)} + N_2^{(i)}}{2} \quad \text{(Eq. 5)}$$

2. When i≥1, compare the sum SDs of the current iteration (i) and the previous iteration (i−1), determine "True" if the sum SDs increases, and determine "False" if the sum SDs does not increase:

$$e^{(i)} = \begin{cases} 1, & \text{if } N^{(i)} > N^{(i-1)} \\ 0, & \text{else} \end{cases} \quad \text{(Eq. 6)}$$

When the received signals can be decoded correctly, it can be expected that the number of SDs will decrease, i.e., $N^{(i)} < N^{(i-1)}$, as the number of iterations increases, and $N^{(i)} \approx 0$ can be achieved finally.

3. Set a length of an observation window w, where w≤R and R is the maximum number of iterations, and record the number of SDs with "True":

$$s(w) = \sum_{i=r-w+1, i \geq 1}^{r} e^{(i)}, \quad \text{(Eq. 7)}$$

where r is the current number of iterations.

4. Set divergence conditions of the turbo decoder 30 as follows: $w_d$ is a length of a divergence observation window, $s_d$ is a divergence threshold, $s_d \leq w_d$, and $s(w_d) \geq s_d$. If the divergence conditions are satisfied, the number of SDs does not decrease as the number of iterations increases. The receiving device 20 determines that the CRC are not satisfied even if the subsequent iteration decodings, i=r+1, r+2, . . . , R−1, are performed. Thus, the receiving device 20 may terminate the iteration decoding of the turbo decoder 30 in advance.

5. Set convergence conditions of the turbo decoder 30 as follows: $w_c$ is a convergence observation window, and $s(w_c)$=0. If the convergence conditions are satisfied, the number of SDs decreases as the number of iterations increases, i.e., monotonic decreasing. The receiving device 20 determines that the CRC may be satisfied before the subsequent iteration reaches the maximum predetermined value. Thus, the turbo decoder 30 keep performing the iteration decoding until the CRC is satisfied or the maximum predetermined number of iterations is reached.

6. Turn off the function of the SD by setting $w_d$ and $s_d$ of the divergence conditions, such as setting $w_d$=R and $s_d$=R.

7. When $w_c$ and $w_d$ are set, $w_c > w_d$ should be satisfied to save the power consumption.

8. Consider the implementation of the hardware architecture, the receiving device 20 needs to temporarily store the output of the previous iteration when the HDA and the SCR are performed to determine the SD. In contrast, the receiving device 20 does not need to temporarily store the output of the previous iteration, when the SDR is performed to determine the SD.

Figure 4:
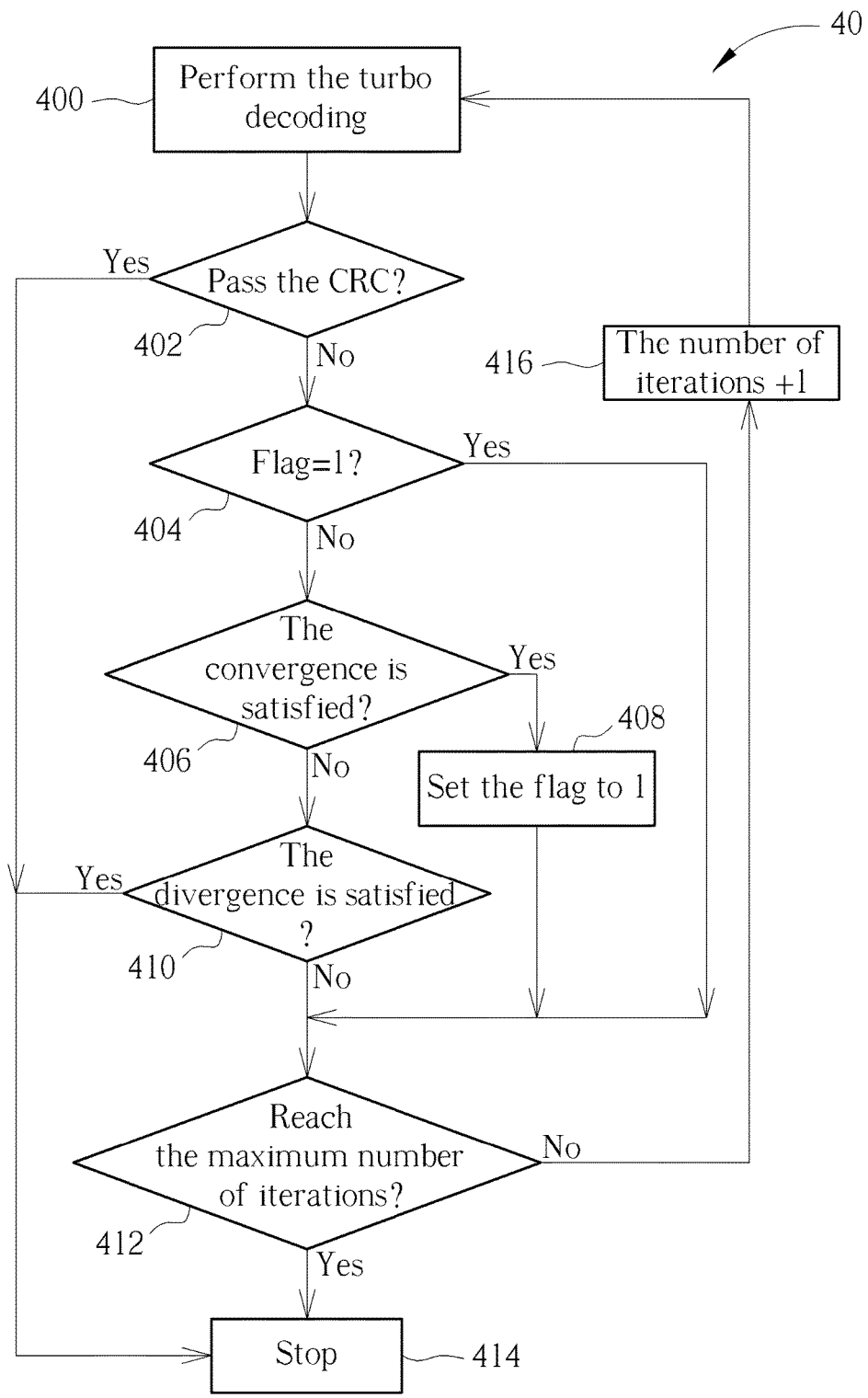
FIG. 4 is a flowchart of a process according to an example of the present invention.

The steps and the principles mentioned above can be summarized into a process 40 in FIG. 4 which includes Steps 400-416. The detailed operation can be referred to the previous description, and is not narrated herein.

Figure 5:
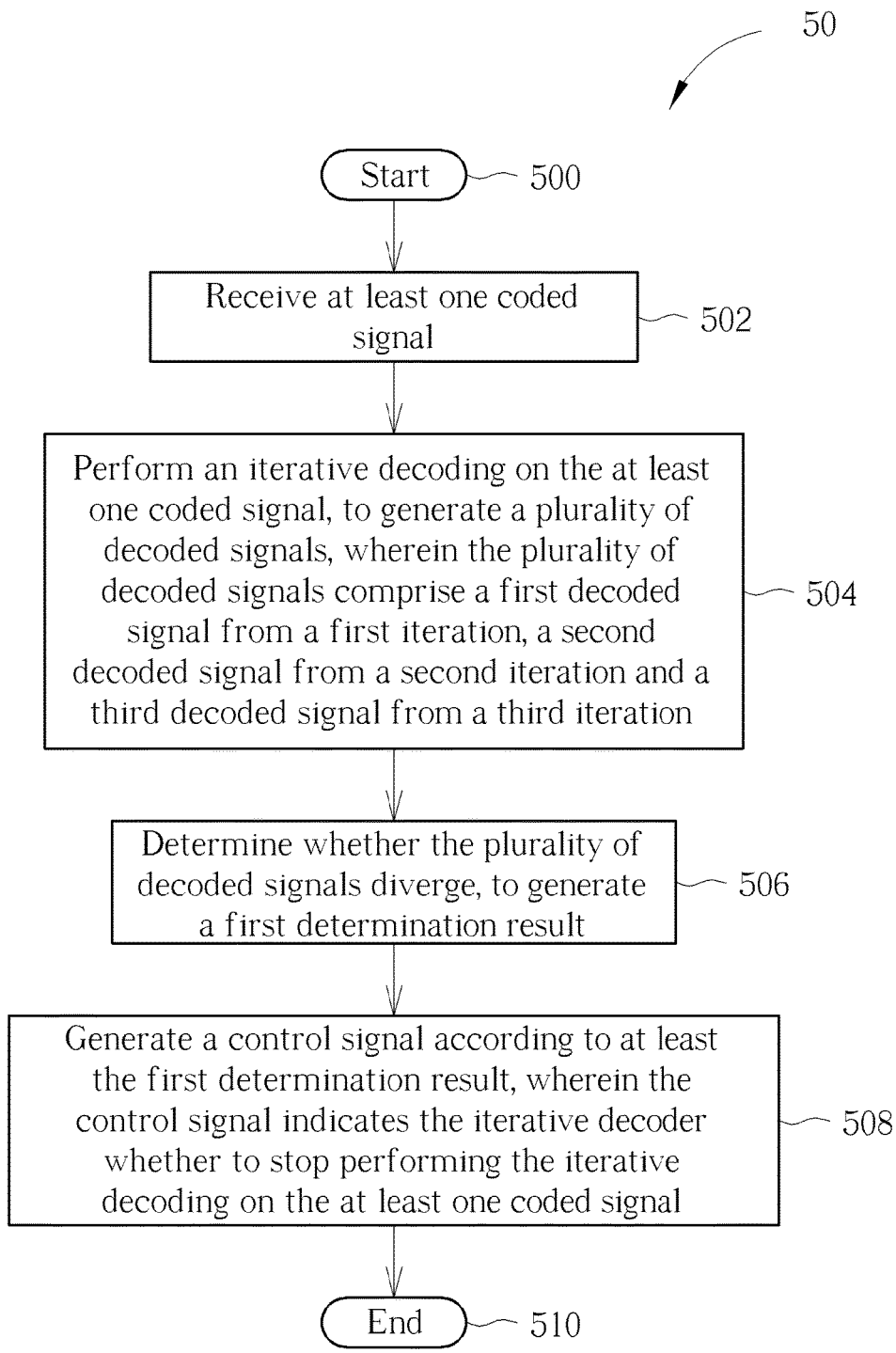
FIG. 5 is a flowchart of a process according to an example of the present invention.

The operation method of the receiving device 10 mentioned above can be summarized into a process 50 in FIG. 5 which includes the following steps:

Step 500: Start.

Step 502: Receive at least one coded signal.

Step 504: Perform an iterative decoding on the at least one coded signal, to generate a plurality of decoded signals, wherein the plurality of decoded signals comprise a first decoded signal from a first iteration, a second decoded signal from a second iteration and a third decoded signal from a third iteration.

Step 506: Determine whether the plurality of decoded signals diverge, to generate a first determination result.

Step 508: Generate a control signal according to at least the first determination result, wherein the control signal indicates the iterative decoder whether to stop performing the iterative decoding on the at least one coded signal.

Step 510: End.

Figure 6:
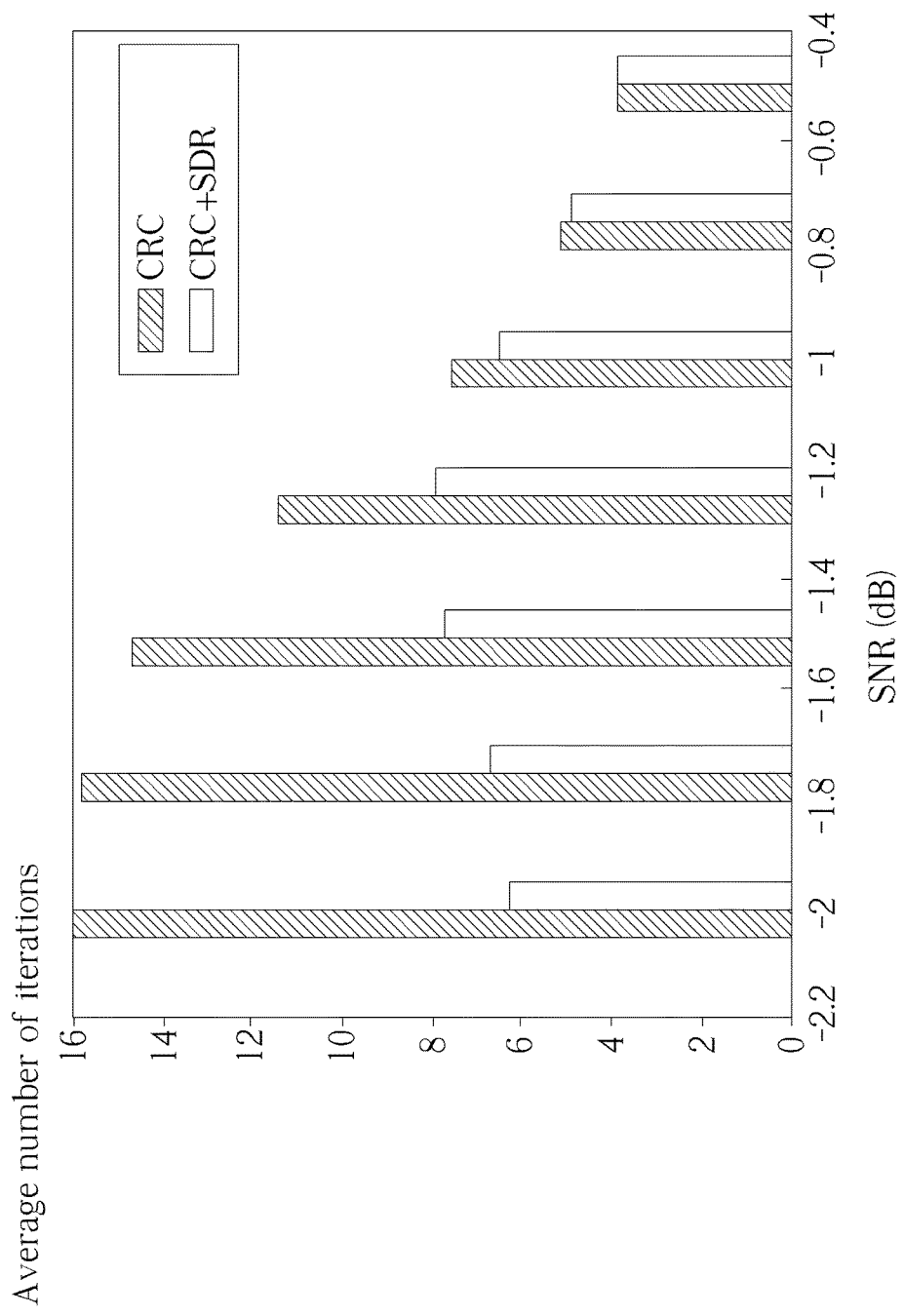
FIG. 6 is a simulation result figure according to an example of the present invention.

FIG. 6 is a simulation result figure according to an example of the present invention. Simulation environment is set to long-term evolution-advanced (LTE-A). A bandwidth is 10 MHz, and a modulation and coding scheme (MCS) 5 is used. A channel is an additive white Gaussian Noise (AWGN) channel, and a maximum number of iterations is 16. In FIG. 6, the average number of iterations is used for comparing two early termination methods: the CRC (the prior art) and the CRC+the SDR (the present invention), wherein simulation parameters used in the present invention are $w_d=3$, $s_d=2$, $w_c=5$. As can be seen in FIG. 6, the present invention can save 9.5 times of iterative decodings compared to the prior art when a signal-to-noise ratio (SNR) is −2 dB. The present invention can save 1 time of iterative decoding compared to the prior art when the SNR is −1 dB. Thus, the present invention can significantly decrease power consumption.

Figure 7:
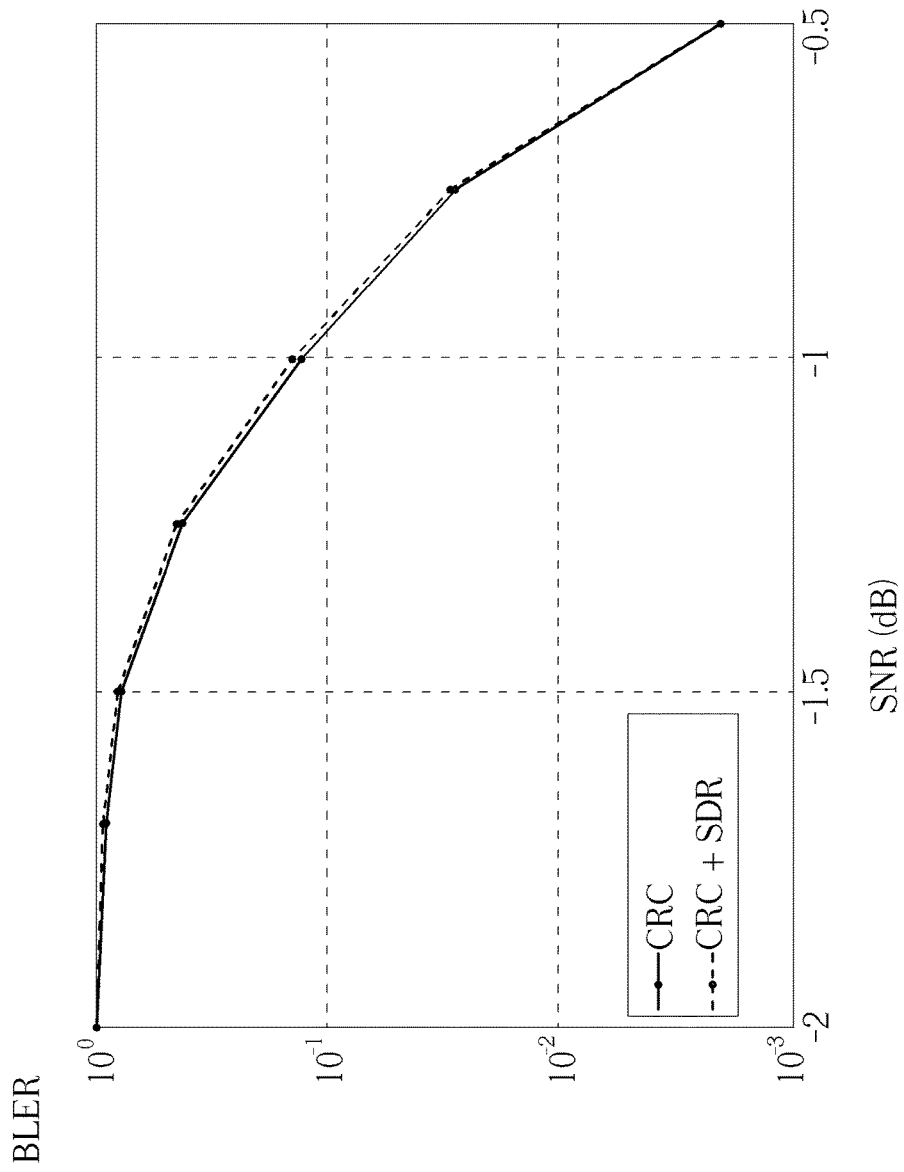
FIG. 7 is a simulation result figure according to an example of the present invention.

FIG. 7 is a simulation result figure according to an example of the present invention. Simulation parameters for FIG. 7 are the same as those for FIG. 6. As can be seen in FIG. 7, considering a block error rate (BLER) of 10%, a performance loss of the present invention is only 0.015 dB compared to that of the prior art. Considering a BLER of 1%, a performance loss of the present invention is only 0.005 dB compared to that of the prior art. Thus, the present invention can decrease the power consumption at cost of a slight performance loss.

It should be noted that the iterative decoder 100, the first determination unit 110, the second determination unit 200 and the control unit 120 may be integrated into one or multiple units according to design considerations or system requirements. In addition, the receiving device 10 and/or the receiving device 20 and the units therein may be realized by hardware (e.g., circuit), software, firmware, an electronic system or a combination of the devices mentioned above, but is not limited herein.

To sum up, the present invention provides a device and a method of controlling an iterative decoder. Subsequent iteration decodings are directly stopped to avoid performing unnecessary iteration decodings when determining that received signals are difficult to be correctly decoded. Thus, the present invention not only saves unnecessary power consumption but also reduces a decoding delay.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A receiving device, comprising:
   an iterative decoder, for receiving at least one coded signal and for performing an iterative decoding on the at least one coded signal, to generate a plurality of decoded signals, wherein the plurality of decoded signals comprise a first decoded signal from a first iteration, a second decoded signal from a second iteration and a third decoded signal from a third iteration;
   a first determination unit, coupled to the iterative decoder, for determining whether the plurality of decoded signals diverge, to generate a first determination result;
   a control unit, coupled to the first determination unit, for generating a control signal according to at least the first determination result, wherein the control signal indicates the iterative decoder whether to stop performing the iterative decoding on the at least one coded signal; and
   a second determination unit, coupled to the iterative decoder and the control unit, for performing an error detection on the plurality of decoded signals, to generate a second determination result;
   wherein the control unit generates the control signal according to the first determination result and the second determination result.

2. The receiving device of claim 1, wherein the control unit indicates the iterative decoder to stop performing the iterative decoding on the at least one coded signal, when the second determination result indicates that the plurality of decoded signals pass the error detection.

3. The receiving device of claim 1, wherein the control unit indicates the iterative decoder to keep performing the iterative decoding on the at least one coded signal, when the second determination result indicates that the plurality of decoded signals do not pass the error detection and the first determination result indicates that the plurality of decoded signals do not diverge.

4. The receiving device of claim 1, wherein the iterative decoder comprises one of a turbo decoder and a Low Density Parity Check Code (LDPC) decoder.

5. The receiving device of claim 1, wherein the first determination unit performs a sign difference (SD) operation on the plurality of decoded signals to determine whether the plurality of decoded signals diverge.

6. The receiving device of claim 5, wherein the first determination unit performs the following steps:
   performing the SD operation on the plurality of decoded signals for computing a sum of a plurality of corresponding differences between the plurality of decoded signals, respectively, to generate a plurality of sum signals;
   comparing a size of the plurality of sum signals, respectively, to generate a plurality of comparison results; and
   determining whether the plurality of decoded signals diverge according to the plurality of comparison results to generate the first determination result.

7. The receiving device of claim 5, wherein the first determination unit performs the SD operation on a plurality of corresponding differences between the plurality of decoded signals, wherein the plurality of corresponding differences comprise at least one of a plurality of log-likelihood ratio (LLR) differences, a plurality of extrinsic information differences and a plurality of priori information differences.

8. A controlling method, for controlling operations of an iterative decoder, comprising:
   receiving at least one coded signal;
   performing an iterative decoding on the at least one coded signal, to generate a plurality of decoded signals, wherein the plurality of decoded signals comprise a first decoded signal from a first iteration, a second decoded signal from a second iteration and a third decoded signal from a third iteration;

determining whether the plurality of decoded signals diverge, to generate a first determination result;

generating a control signal according to at least the first determination result, wherein the control signal indicates the iterative decoder whether to stop performing the iterative decoding on the at least one coded signal;

performing an error detection on the plurality of decoded signals, to generate a second determination result; and generating the control signal according to the first determination result and the second determination result.

9. The controlling method of claim 8, wherein steps of generating the first determination result comprising:

performing a sign difference (SD) operation on the plurality of decoded signals for computing a sum of a plurality of corresponding differences between the plurality of decoded signals, respectively, to generate a plurality of sum signals;

comparing a size of the plurality of sum signals, respectively, to generate a plurality of comparison results; and generating the first determination result according to the plurality of comparison results.

* * * * *